United States Patent
Ahmed et al.

(10) Patent No.: US 10,955,544 B2
(45) Date of Patent: Mar. 23, 2021

(54) MEASUREMENT SETUP, REFERENCE REFLECTOR AS WELL AS METHOD FOR MEASURING ATTENUATION

(71) Applicant: Rohde & Schwarz GmbH & Co. KG, Munich (DE)

(72) Inventors: Sherif Sayed Ahmed, Starnberg (DE); Frank Gumbmann, Nuremberg (DE); Tobias Koeppel, Munich (DE); Michael Freissl, Munich (DE); Christian Evers, Heimstetten (DE); Thomas Fischer, Puchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 282 days.

(21) Appl. No.: 16/008,979

(22) Filed: Jun. 14, 2018

(65) Prior Publication Data
US 2019/0383935 A1    Dec. 19, 2019

(51) Int. Cl.
*G01S 13/89*    (2006.01)
*G06T 7/73*    (2017.01)

(52) U.S. Cl.
CPC ............... *G01S 13/89* (2013.01); *G06T 7/74* (2017.01)

(58) Field of Classification Search
CPC .................. G01S 13/89; G06T 78/74
USPC ........................................... 342/25 A
See application file for complete search history.

(56) References Cited

U.S. PATENT DOCUMENTS

| 5,371,505 A | 12/1994 | Michaels |
| 6,067,050 A | 5/2000 | Shaker et al. |
| 9,991,591 B1* | 6/2018 | Rowell ................. H01Q 1/125 |
| 2017/0276523 A1* | 9/2017 | Lally ..................... G01M 11/00 |
| 2020/0136263 A1* | 4/2020 | Lee ....................... G01S 13/753 |

OTHER PUBLICATIONS

Harter, M., et al., "Self-Calibration of a 3-D-Digital Beamforming Radar System for Automotive Applications with Installation Behind Automotive Covers," EEE Transactions on Microwave Theory and Techniques 64(9):1-7, Sep. 2016.

* cited by examiner

*Primary Examiner* — Frank J McGue
(74) *Attorney, Agent, or Firm* — Christensen O'Connor Johnson Kindness PLLC

(57) ABSTRACT

A measurement setup for measuring attenuation through an irregular surface of a device under test is described. The measurement setup comprises a positioning system, a reference reflector having a collection of diffuse scattering members, and a three dimensional imaging system. The measurement setup has a reference state and a measurement state, wherein respective images are taken in the different states. The imaging system is configured to compare the images taken in the reference state and the measurement state to determine the attenuation of the device under test. Further, a reference reflector as well as a method for measuring attenuation are described.

18 Claims, 4 Drawing Sheets

MEASUREMENT SETUP, REFERENCE REFLECTOR AS WELL AS METHOD FOR MEASURING ATTENUATION

FIELD OF THE DISCLOSURE

Embodiments of the present disclosure relate generally to a measurement setup for measuring attenuation through an irregular surface of a device under test. Further, embodiments of the present disclosure relate generally to a reference reflector for use in a measurement setup for measuring attenuation through an irregular surface. Embodiments of the present disclosure also relate generally to a method for measuring attenuation of an irregular surface of a device under test.

BACKGROUND

Nowadays, radar sensors are used in vehicles for observing the environment of the respective vehicle, for instance the distance to a preceding vehicle or rather the distance to a vehicle behind is observed by the radar sensors. A driver of the vehicle may be warned if a distance observed becomes too small. Typically, the radar sensors are mounted behind the front car bumper as well as the rear car bumper. Since the car bumpers are painted with a metallic paint, undesirable attenuations of the radar signals occur which are caused by the paint.

Generally, the occurring attenuation is highly dependent on the paint color, its density, its metallic content, its thickness, its mixture and so on. Thus, it is hard to control or rather to predict the resulting attenuation value of a car bumper in industrial production since each individual paint has to be examined individually.

The measurement of the attenuation is further complicated as the car bumpers typically have an irregular surface.

So far, point-like measurements are done in industrial production wherein a few singular points are investigated. The complete field of view of the radar sensors, also called radar field of view, cannot be covered by such a measurement type in a practical time. Hence, it is not possible to get a reliable overview of the attenuation of the whole car bumper.

For scientific or rather academic applications, a radio frequency sensor module can be used that is remotely placed behind the respective car bumper wherein a direct transmission measurement is performed, for instance the scattering parameter S21 obtained by a vector network analyzer is taken into account. However, these measurements are impractical in industrial production due to several facts, for instance high tolerances and the radio frequency cables that have to be extended into the inside body of the bumper.

Accordingly, there is a need for a possibility to measure attenuation through an irregular surface of a device under test such as a car bumper in a practical and cost-efficient manner so that it can be applied in industrial production of the respective device under test.

SUMMARY

Embodiments of the present disclosure provide a measurement setup for measuring attenuation through an irregular surface of a device under test, comprising:
a positioning system;
a reference reflector having a collection of diffuse scattering members;
a three dimensional imaging system having a field of view, the three dimensional imaging system being configured to use electromagnetic signals in the frequency range of a radar system;
the measurement setup having a reference state and a measurement state;
the positioning system, in the reference state, being configured to position the reference reflector without the device under test in the field of view of the imaging system;
the positioning system, in the measurement state, being further configured to position the reference reflector and the device under test in the field of view of the imaging system, the device under test being located between the imaging system and the reference reflector;
the imaging system, in the reference state, being configured to take a reference image of the reference reflector;
the imaging system, in the measurement state, being configured to take a measurement image of the reference reflector while the device under test is arranged between the imaging system and the reference reflector;
the imaging system being further configured to compare the images taken in the reference state and the measurement state to determine the attenuation of the device under test.

Accordingly, the attenuation of the device under test having an irregular surface such as a car bumper can be measured easily and in a cost-efficient manner by the measurement setup since reflection imaging against a reference target is used for generating a reference image. The reference image, namely the image taken in the reference state, is later used for comparison purposes in order to determine the attenuation of the device under test with its irregular surface. Put it another way, the attenuation of the device under test is obtained by measuring the collective relative change in the reflectivity of the diffuse scattering members of the reference reflector used in both measurements, namely the reference measurement as well as the measurement of the device under test. Thus, the reflection of the device under test itself, namely its irregular shape, is removed as this reflection occurs at a wrong reflection plane, namely a reflection plane being distanced to the reference reflector. In fact, the imaging system relies on the reflection of the reference reflector for determining the attenuation of the device under test.

The three dimensional imaging system uses electromagnetic signals in the frequency range of radar systems, for instance an ultimate radar system. The applied frequency range corresponds to the one of the radar sensors used by the device under test, for instance the car bumper. Thus, the electromagnetic signals may have a frequency between 75 and 82 GHz, for instance a frequency of 77 GHz or 79 GHz, so that the wavelength of the electromagnetic signals corresponds substantially to 4 mm. Thus, the three dimensional imaging system may be a highly resolved millimeter wave panel (mmWave panel) so as to image through the device under test, namely the reference reflector placed behind the device under test.

Generally, the three dimensional imaging system has a defined radiation pattern, namely radiation beam(s), so that the electromagnetic signals impinge on the device under test in a defined manner.

As the measurement setup relies on the reflection of the reference reflector, it becomes obvious that at least a part of the signals emitted by the three dimensional imaging system goes through the device under test, for example in a parallel or rather straight manner. Hence, the transmission thickness, namely the thickness of the material of the device under test to be traversed by the electromagnetic signals, is constant.

In the measurement state, the reference reflector may be located inside the device under test, namely the car bumper. Hence, the reference reflector may be embedded in the device under test. Alternatively, the reference reflector is positioned (closely) behind the device under test, for example directly behind. In fact, the reference reflector is positioned to correspond to the intended position of the at least one radar sensor being used by the device under test.

The positioning system ensures that the reference reflector is positioned in the correct position. For this purpose, the positioning system may position the reference reflector in the reference state and in the measurement state so that the same location of the reference reflector is ensured for the reference reflector during both measurements, namely the reference measurement and the measurement of the device under test.

The collection of the diffuse scattering members may correspond to a matrix so that the individual scattering members are located in a matrix-like arrangement. The respective distances between neighbored scattering members may be equal. Thus, the individual scattering members can be distributed over a surface of the reference reflector in a homogeneous manner.

The diffuse scattering members ensure that the electromagnetic signals radiated by the three dimensional imaging system are scattered in all directions.

According to an aspect, the imaging system is configured to locate the reference reflector and its scattering members by using geometric matching. This can be ensured due to the reference image taken in the reference state since only the reference reflector is located in the field of view of the three dimensional imaging system. Thus, the respective locations of the individual scattering members can be located by the imaging system. The imaging system can locate and extract the collective reflectivity of the reference reflector at the individual scattering members. Put it another way, the three dimensional imaging system, in the measurement state, already knows the locations of the diffuse scattering members or at least expects the individual scattering members at certain locations (due to the same position of the reference reflector and the geometric matching). Accordingly, the referenced image taken provides some kind of a template with regard to the locations of the individual scattering members. By using this template in the measurement state, the imaging system is enabled to identify the scattering members in the image taken in the measurement state more easily.

For instance, locations within a range of 3 mm deviation of the template, namely 3 mm to the left and/or 3 mm to the right of the expected locations, may be taken into account. Hence, minor deviations do not impair the measurement result.

Another aspect provides that the imaging system being configured to compare the image strength at the locations of at least two scattering members of the reflector while comparing the images taken in the reference state and the measurement state. The attenuation of the device under test can be retrieved easily by taken the image strength into account of both images taken so that the attenuation merely corresponds to the difference in reflectivity strength of both images. Since the reflectivity strength or rather the image strength is taken into account at the location of scattering members, it becomes obvious that the irregular surface of the device under test is not taken into account. In fact, reflections at the irregular surface are assigned to a different reflection plane compared to the one of the reference reflector. In other words, the reflection of the device under test itself, namely its irregular surface, is removed so that these signals do not contribute to the determination of the attenuation of the device under test.

According to an aspect, the imaging system is further configured to disregard the reflection originating from the irregular surface. The imaging system only relies on reflections of the reference reflector for determining the attenuation of the device under test. Since the irregular surface is assigned to a different reflection plane, these reflections do not contribute. In fact, disturbing contributions of the irregular surface are disregarded since the imaging system relates to the reflection plane assigned to the reference reflector.

Moreover, the imaging system may be configured to take only the scattering members into account that contribute to the intersection between the irregular surface of the device under test and an intended field of view of at least one radar sensor of the device under test. The intended field of view of the at least one radar sensor, also called radar field of view, corresponds to a specific area on the irregular surface of the device under test. As this area is of interest for the attenuation determination, only these scattering members are taken into account that have a contribution to this specific area. The other areas of the irregular surface which do not intersect with the radar field of view are less interesting so that the scattering members assigned to these areas are neglected. Put it another way, some scattering members are excluded if they are located outside of the intended radar field of view of the device under test on the irregular surface of the device under test. Thus, only specific scattering members are selected that are relevant for the intended radar field of view with respect to the irregular surface of the device under test.

Moreover, the reference reflector may be positioned by the positioning system such that the scattering members face the imaging system. Hence, the electromagnetic signals transmitted by the imaging system impinge on the scattering members of the reference reflector (after traversing the device under test in the measurement state) so that the electromagnetic signals are reflected by the scattering members. In fact, the scattering members reflect the electromagnetic signals towards the imaging system.

The imaging system is generally configured to receive the reflected electromagnetic signals and to process these signals appropriately.

The field of view of the imaging system may be aligned with a radar field of view provided by at least one radar sensor of the device under test. The electromagnetic signals emitted by the imaging system may cross the irregular surface of the device under test in the same area as the radar signals of the intended radar field of view do. Thus, the whole intersection surface, namely the surface area of the irregular surface that is intersected by the radar field of view, is radiated by the three dimensional imaging system. In addition, neighbored areas on the irregular surface are not irradiated by the imaging system.

Moreover, the positioning system may be at least one of a fixed positioning system and a movable positioning system. The fixed positioning system ensures that at least the reference reflector is held at the same position during both measurement. The moveable positioning system is enabled to irradiate the device under test under different positions with regard to the imaging system. However, the moveable positioning system also ensures that the reference reflector is held in the same position during the reference measurement as well as the measurement of the device under test as it the positioning system is controlled to take the same position.

For instance, the positioning system comprises a robot. The robot can be controlled appropriately so that the desired positions for the reference reflector as well as the device under test can be obtained.

Another aspect provides that the positioning system comprises at least one gripper being configured to position at least one of the reference reflector and the device under test. The gripper can be used for easily holding the at least one respective component, namely the reference reflector and/or the device under test.

In some embodiments, the gripper is capable of holding the irregular surface of the device under test in the desired position, namely in front of the reference reflector.

For instance, the at least one gripper has a vacuum sucker. The device under test with its irregular surface can be held easily by the gripper. Further, the component may be gripped at different locations easily without any wear.

The positioning system may be free of highly reflective components in the area used for measuring the attenuation. The measurements are not disturbed by reflections of the positioning system.

For instance, at least the gripper is free of highly reflective components since the gripper is located close to the reference reflector and/or the device under test during the respective measurement.

The reference reflector may comprise a base to which the several individual scattering members are attached. The several individual scattering members each may have a curved tip for reflection. The size of the several individual scattering members in some embodiments is comparable to the wavelength of a signal used for attenuation measurement, the several individual scattering members being arranged with regard to the base such that front and back reflections occur which are separable by the imaging system. Thus, the distance between the tips of the individual scattering members and the base to which the several individual scattering members are attached by their opposite ends is high enough so that the imaging system can separate the reflections that occur at the base and the tips of the several individual scattering members. Thus, two reflection planes are provided by the reference reflector.

In some embodiments, the base comprises an electromagnetic absorber. The electromagnetic absorber ensures that background reflection is reduced, namely the back reflection. The absorber may be provided by an electromagnetic absorbing layer. The layer may be painted, sprayed and/or coated on the base.

In some embodiments, the curved tip may be ellipsoidal or hemisphere.

In some embodiments, the scattering members may be formed by sticks having a diameter corresponding to the wavelength of the signal used for measurement. Thus, the individual scattering members are shaped substantially cylindrical with a certain diameter.

Further, embodiments of the present disclosure provide a reference reflector for use in a measurement setup for measuring attenuation through an irregular surface. The reference reflector comprises a base and several individual scattering members attached to the base. The several individual scattering members in some embodiments each have a curved tip for reflection, and the size of the several individual scattering members being comparable to the wavelength of a signal used for attenuation measurement. The several individual scattering members are arranged with regard to the base such that front and back reflections occur which are separable by an imaging system. The front reflection may occur by the tips of the several individual scattering members whereas the back reflection is assigned to the reflection at the base. Thus, the several individual scattering members are long enough so that the imaging system can differentiate between both reflection planes.

The base may comprise an electromagnetic absorber. The electromagnetic absorber ensures that background reflection is reduced, namely the back reflection. The absorber may be provided by an electromagnetic absorbing layer. The layer can be provided by a paint, a spray and/or coating.

Further, embodiments of the present disclosure provide a method for measuring attenuation of an irregular surface of a device under test, with the following steps:

positioning a reference reflector having a collection of diffuse scattering members in front of a three dimensional imaging system that uses electromagnetic signals in the frequency range of a radar system;

taking a reference image of the reference reflector by using the imaging system;

positioning the device under test and the reference reflector in front of the imaging system so that the device under test is arranged between the reference reflector and the imaging system;

taking a measurement image of the reference reflector while the device under test is arranged between the imaging system and the reference reflector by using the imaging system; and comparing the images taken to determine the attenuation of the device under test.

The characteristics and advantages mentioned above with regard to the measurement setup also apply for the method mentioned above in a similar manner.

In some embodiments, the collective reflectivity at the scattering members is located and extracted by the imaging system after the reference image was taken. In a similar manner, the collective reflectivity at the scattering members is located and extracted by the imaging system after the measurement image was taken. Hence, the respective collective reflectivity can be compared.

When comparing both images, the attenuation can be determined easily while referring to the collective reflectivity at the scattering members, for example the difference.

According to an aspect, the image strength at the locations of at least two scattering members of the reference reflector are compared while comparing the images taken. The attenuation of the device under test is determined by comparing the image strength of the reflected signal at locations assigned to the reference reflector. Hence, the reference plane assigned to the reference reflector is taken into account. In other words, the reflection of the irregular surface of the device under test is removed as it is assigned to a different reflection plane.

According to another aspect, reflection originating from the irregular surface is disregarded. Thus, only the reflections occurring from scattering members of the reference reflector, for example the ones assigned to the radar field of view, are taken into account for measurement purposes. In some embodiments, the reflections originating from the irregular surface are assigned to a different reflection plane compared to the one of the reference reflector.

Moreover, only the scattering members in some embodiments are taken into account that contribute to the intersection between the irregular surface of the device under test and an intended field of view of at least one radar sensor of the device under test. Thus, a certain area of the irregular surface of the device under test is measured with regard to attenuation since this area will be irradiated by the intended radar field of view of the at least one radar sensor of the device under test. In fact, only this area of the irregular surface is of interest with regard to the transmittance of the device under test.

The attenuation of the device under test can be determined by averaging attenuation values due to the attenuation values determined for the respective scattering members taken into account.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
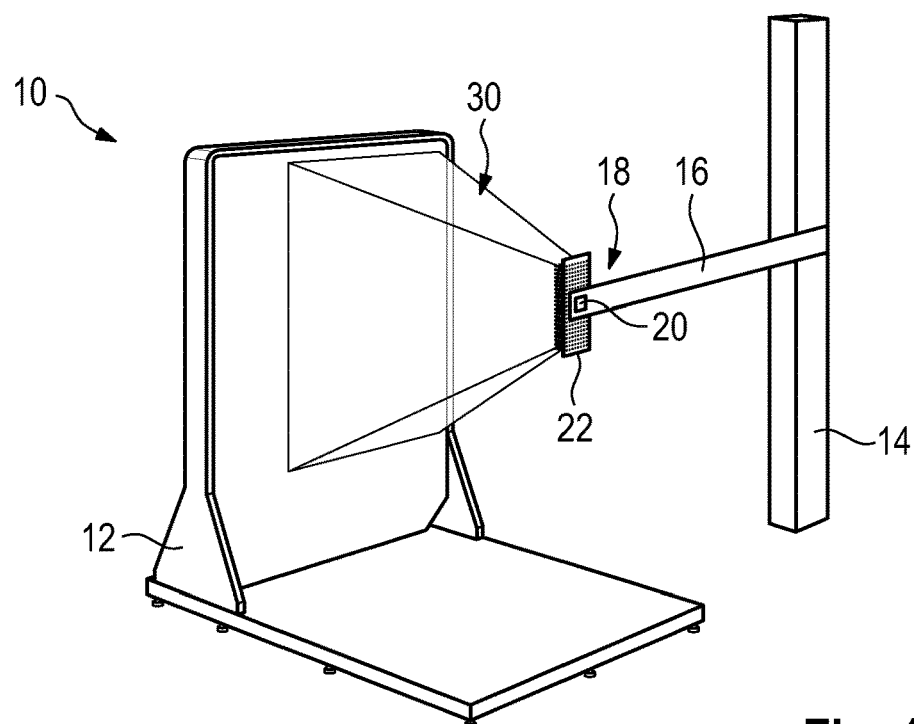
FIG. 1 shows a measurement setup in a reference state according to the present disclosure.

In FIG. 1, a measurement setup 10 for measuring attenuation through an irregular surface of a device under test is shown in a reference state. As shown in FIG. 1, the measurement setup 10 comprises a three dimensional system 12 that has several antennas for transmitting and/or receiving electromagnetic signals as will be described later. The three dimensional imaging system 12 uses electromagnetic signals in the frequency range of a radar system such as an ultimate radar system. Thus, the electromagnetic signals may have a frequency between 75 and 82 GHz, for example 77 GHz and 79 GHz, so that the wavelength of the electromagnetic signals corresponds to 4 mm. Therefore, the three dimensional imaging system 12 is also called mmWave imaging system.

The measurement setup 10 further comprises a positioning system 14 that has a robot 16 and at least one gripper 18 for gripping components and holding the respective component in a desired position. The at least one gripper 18 may be located at an end of a robotic arm of the robot 16. In the shown embodiment, the gripper 18 has a vacuum sucker 20 so that the respective component is held by the gripper 18 via a vacuum applied.

In FIG. 1, the measurement setup 10 is shown in its reference state wherein the measurement setup 10 is used to take a reference image of a reference reflector 22 that is held by the at least one gripper 18 in a reference position. The reference reflector 22 is shown in more detail in FIGS. 5 to 7. The reference reflector 22 comprises a base 24 being provided by a plate from which diffuse scattering members 26 extend in a substantially perpendicular direction.

Figure 5:
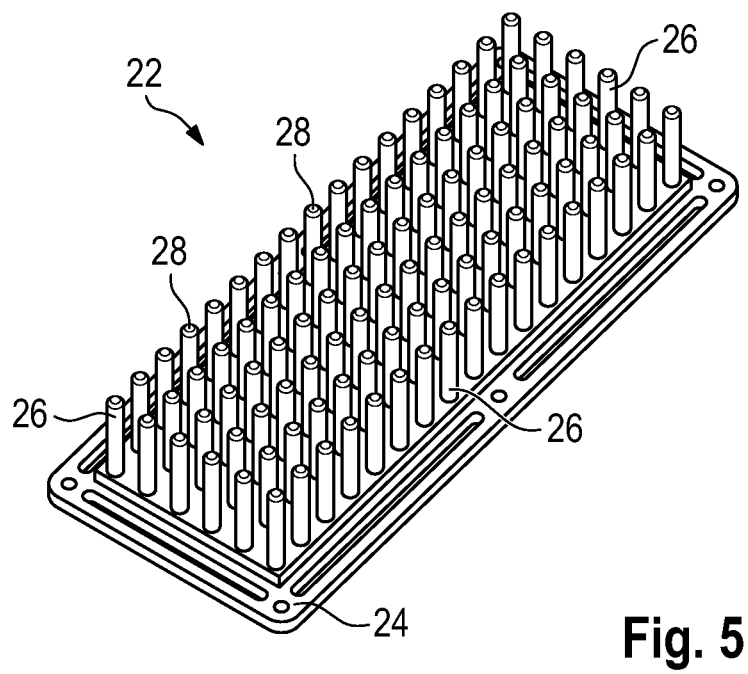
FIG. 5 shows a perspective view of a reference reflector according to the present disclosure.
Figure 6:
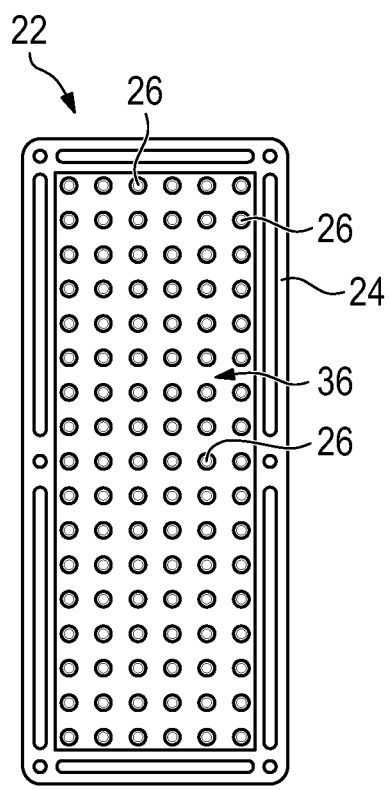
FIG. 6 shows a top view of the reference reflector of FIG. 5.
Figure 7:
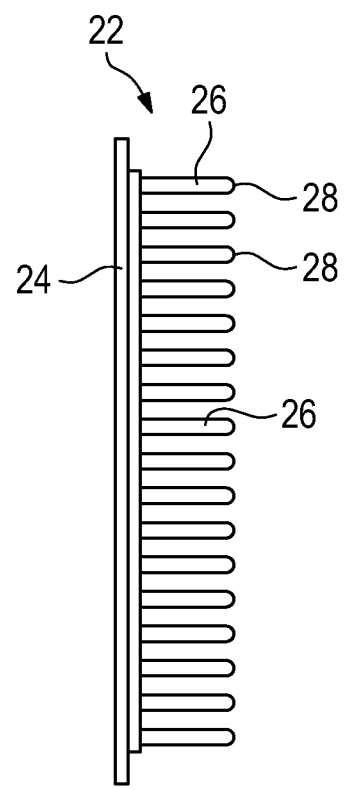
FIG. 7 shows a side view of the reference reflector of FIGS. 5 and 6.

As shown in FIGS. 5-7, the diffuse scattering members 26 are arranged in a matrix on the base 24 wherein the scattering members 26 each have a curved tip 28, for instance a hemisphere or an ellipsoidal tip, so that electromagnetic signals impinging on the scattering members 26 are scattered in a diffuse manner. The size of the several individual scattering members 26 is substantially comparable to the wavelength of the signals emitted by the imaging system 12. Particularly, the scattering members 26 are shaped cylindrically wherein their diameter corresponds to the wavelength of the electromagnetic signals emitted by the imaging system 12, namely about 4 mm.

Furthermore, the several individual scattering members 26 have a length that ensures that two different reflection planes are provided by the reference reflector 22 which can be differentiated by the imaging system 12. The reflection planes provided correspond to the reflection at the tips 28, also called front reflection, as well as reflections at the base 24, also called back reflection. Hence, front and back reflections occur when the electromagnetic signal impinges on the reference reflector 22. In some embodiments, the scattering members 26 correspond to sticks.

As shown in FIG. 6, the individual scattering members 26 are spaced apart from each other by substantially the same distance so that a homogenous distribution of scattering members 26 is obtained.

Returning to FIG. 1, the field of view 30 of the imaging system 12 is illustrated appropriately which irradiates the reference reflector 22 via a certain area as will be described later with respect to FIG. 2.

Figure 8:
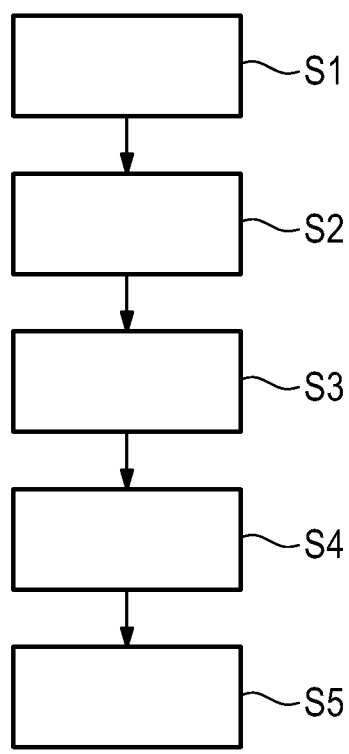
FIG. 8 shows a flow-chart illustrating a method for measuring attenuation according to the present disclosure.

For measuring the attenuation of a device under test, the reference reflector 22 is positioned in front of the imaging system 12 via the positioning system 14 in a first step S1 (see FIG. 8). The reference reflector 22 is positioned such that the scattering members 26 face the imaging system 12 so that the electromagnetic signals emitted by the imaging system 12 impinge on the scattering members 26 which scatter the signals in a diffuse manner.

In a second step S2, the imaging system 12 takes a reference image of the reflectance of the reference reflector 22. Particularly, the image strength at the different locations assigned to the scattering members 26 is evaluated by the imaging system 12. Hence, the collective reflectivity at the individual scattering members 26 is located and extracted so that a template with regard to the locations of the individual scattering members 26 is obtained.

Figure 2:
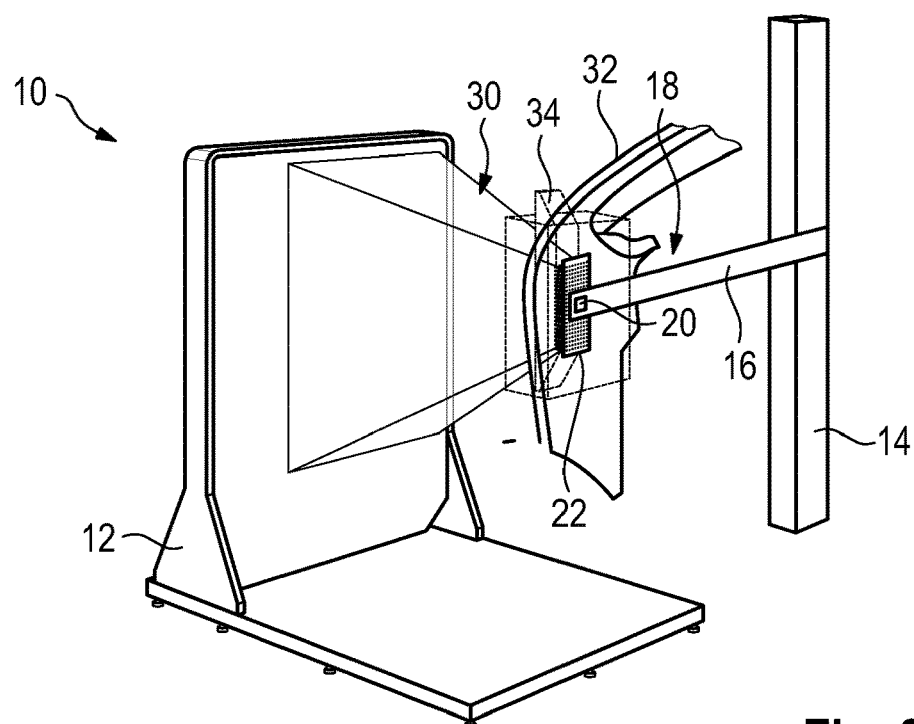
FIG. 2 shows the measurement setup of FIG. 1 in a measurement state.

In a next step S3, which is illustrated in FIG. 2, a device under test 32 is held by the positioning system 14 wherein the device under test 32 is positioned between the imaging system 12 and the reference reflector 22.

Then, the device under test 32 as well as the reference reflector 22 positioned behind the device under test 32 are irradiated by the imaging system 12 (step S4). Thus, the electromagnetic signals emitted by the imaging system 12 go through the device under test 32 and impinge on the reference reflector 22 located being the device under test 32.

The electromagnetic signals are attenuated by the device under test 32 while they go through (transverse) the device under test 32. Again, the imaging system 12 locates and extracts the collective reflectivity at the individual scattering members 26 so that a measurement image of the reference reflector 22 is taken while the device under test 32 is disposed between the imaging system 12 and the reference reflector 22.

After the imaging system 12 has taken the reference image (S2) as well as the measurement image (S4), the imaging system 12 compares the images taken so as to determine the attenuation of the device under test 32 (step S5).

Therefore, the imaging system 12 relies on a geometric matching with regard to the reference reflector 22 which can be done since the imaging system 12 has taken the reference image in advance so that the different scattering members 26.

Figure 3:
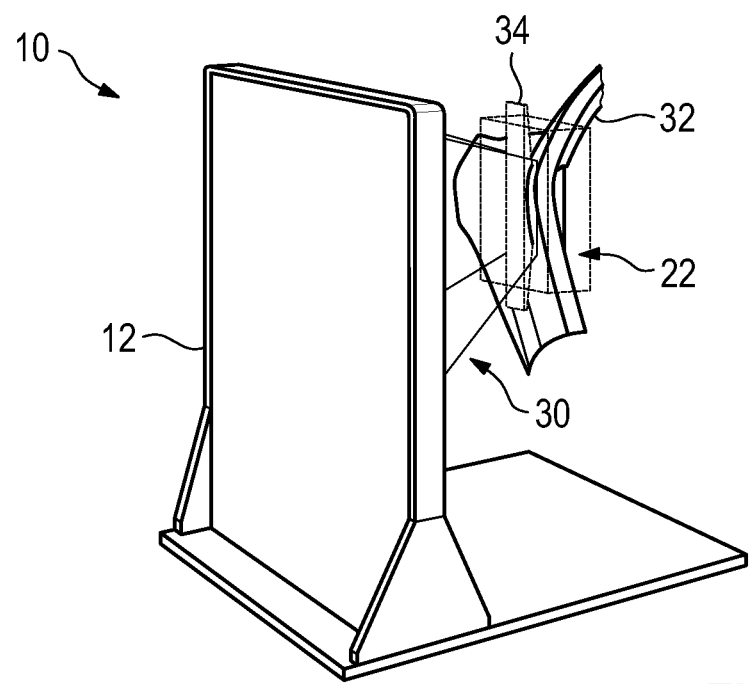
FIG. 3 shows the measurement setup of FIG. 2 in another perspective view without positioning system.
Figure 4:
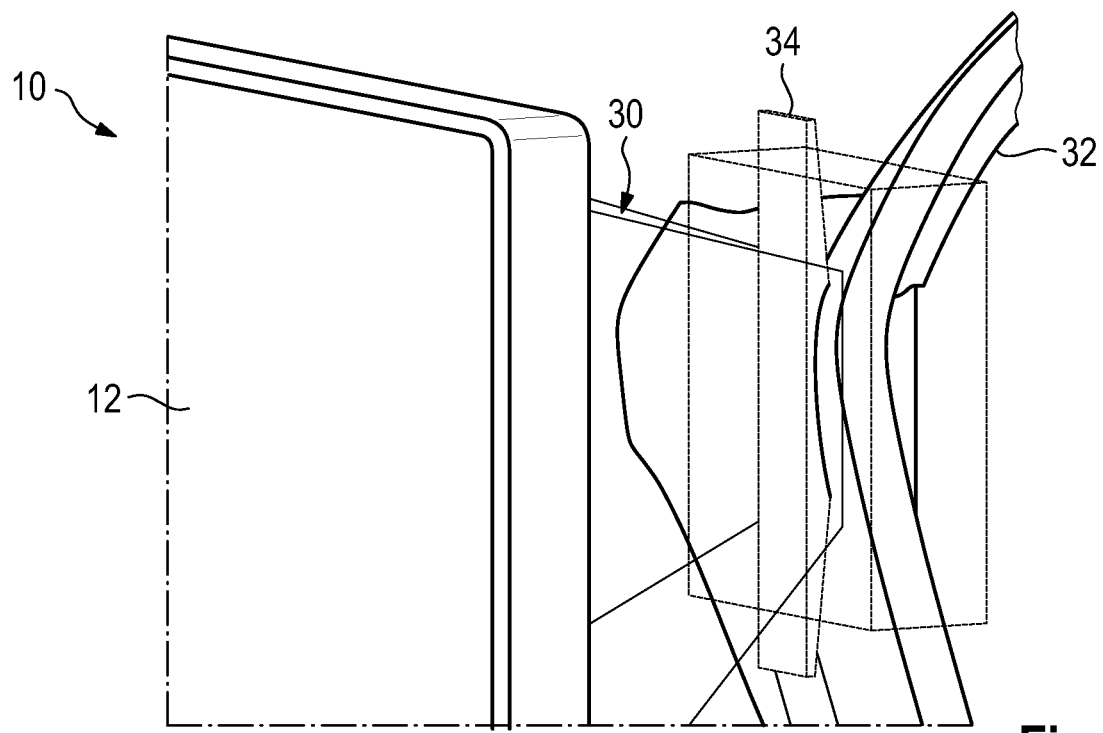
FIG. 4 shows a detail of FIG. 3.

The positioning system 14 generally ensures that the reference reflector 22 is positioned in the same position for both the reference measurement and the measurement of the device under test 32. Hence, a relative reflection imaging against the reference reflector 22 is used for determining the attenuation of the device under test 32. In other words, the geometric matching is done by the imaging system 12 so as to locate the reference reflector 22, for example its scattering members 26, in the measurement state compared to the reference state. Therefore, the three dimensional imaging system 12, in the measurement state, already knows the locations of the diffuse scattering members 26 due to the geometric matching or at least expects the individual scattering members 26 at certain locations As already discussed, the device under test 32 may be a car bumper comprising a radar sensor with an intended radar field of view 34 as illustrated in FIG. 2. The field of view 30 of the imaging system 12 corresponds to the intended radar field of view 34 as will become obvious by taking FIGS. 3 and 4 into account. In other words, the field of view 30 of the imaging system 12 is aligned with the radar field of view 34.

Thus, the attenuation of the irregular surface of the device under test 32 can be determined for the specific area that interacts with the at least one radar sensor of the device under test 32 in real application. The attenuation is measured for the intersection of the radar field of view 34 and the irregular surface of the device under test 32 since the field of view 30 of the imaging system 12 covers the same area at the irregular surface of the device under test 32.

The imaging system 12 is further configured in some embodiments to take only the scattering members 26 into account that contribute to the intersection between the irregular surface of the device under test 32 and the radar field of view 34 of the at least one radar sensor of the device under test 32 or rather the field of view 30 of the imaging system 12 covering the same area on the irregular surface. Thus, the contributions of the scattering members 26 are only used for determining the attenuation of the device under test 32 that may have an influence on the signal attenuation in real operation.

As already discussed above, the imaging system 12 relies on the reflections that occur on the reference reflector 22 for determining the attenuation of the device under test 32. The scattering members 26 of the reference reflector 22 itself are long enough so that two different reflection planes occur, namely the one assigned to the tips 28 of the diffuse scattering members 26 and the one assigned to the base 24. In some embodiments, the base 24 may be covered by an electromagnetic absorber 36 so that background reflection is reduced, namely the back reflection at the base 24. The electromagnetic absorber 36 may be provided by a layer that can be established by a spray, a coating and/or a paint. Therefore, the imaging system 12 substantially receives only the reflections that occur at the tips 28 of the scattering members 26.

The imaging system 12 is also configured to disregard reflections from the irregular surface as these reflections are also assigned to a different reflection plane with respect to the reflection plane of the reference reflector 22, for example the reflection plane of the tips 28.

For improving the measurements, the positioning system 14 is free of highly reflective components in the area used for measuring the attenuation of the device under test 32. This can already be ensured by providing the gripper 18 without any highly reflective components since the gripper 18 is assigned to the measurement area where the reference reflector 22 and/or the device under test 32 are/is held by the gripper 18 during the respective measurement.

Generally, the positioning system 14 may be a fixed positioning system so that the location of the reference reflector 22 is always the same. Alternatively, the positioning system 14 may be a moveable positioning system wherein the positioning system 14 is controlled appropriately so that it can be ensured that the reference reflector 22 is positioned or rather moved in the same position for measurement. The movable positioning system 14 generally ensures that differently sized devices under test 32 can be tested easily by the measurement setup 10.

In general, the imaging system 12 is enabled to take only a certain reflection plane into account for determining the attenuation. The reflection plane used is assigned to the tips 28 of the diffuse scattering members 26.

In fact, reflections being too close, namely those of the irregular surface of the device under test 32, are not taken into consideration for determining the attenuation of the device under test 32. In a similar manner, reflections at the base 24 of the reference reflector 22 are disregarded by the imaging system 12. Those reflections are already suppressed by the electromagnetic absorber 36.

Hence, each diffuse scattering member 26 scatters the respective electromagnetic signals towards the imaging system 12 that in turn can neglect certain scattering members 26, for example their reflected signals, so that only those reflections are taken into account that correspond to the intersection of the radar field of view 34 and the irregular surface of the device under test 32.

Using the reference reflector 22 ensures that the attenuation of the device under test 32 having an irregular surface can be done easily and in a cost-efficient manner. Accordingly, the respective measurements can be done at industrial sites so that the radar systems of a vehicle can be calibrated more easily.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement setup for measuring attenuation through an irregular surface of a device under test, comprising:
   a positioning system;
   a reference reflector having a collection of diffuse scattering members;
   a three dimensional imaging system having a field of view, the three dimensional imaging system being configured to use electromagnetic signals in the frequency range of a radar system;
   the measurement setup having a reference state and a measurement state;
   the positioning system, in the reference state, being configured to position the reference reflector without the device under test in the field of view of the imaging system;
   the positioning system, in the measurement state, being further configured to position the reference reflector and the device under test in the field of view of the imaging system, the device under test being located between the imaging system and the reference reflector;
   the imaging system, in the reference state, being configured to take a reference image of the reference reflector;
   the imaging system, in the measurement state, being configured to take a measurement image of the reference reflector while the device under test is arranged between the imaging system and the reference reflector;
   the imaging system being further configured to compare the images taken in the reference state and the measurement state to determine the attenuation of the device under test.

2. The measurement setup according to claim 1, wherein the imaging system is configured to locate the reference reflector and its scattering members by using geometric matching.

3. The measurement setup according to claim 1, wherein the imaging system is configured to compare the image strength at the locations of at least two scattering members of the reference reflector while comparing the images taken in the reference state and the measurement state.

4. The measurement setup according to claim 1, wherein the imaging system is further configured to disregard the reflection originating from the irregular surface.

5. The measurement setup according to claim 1, wherein the imaging system is configured to take only the scattering members into account that contribute to the intersection between the irregular surface of the device under test and an intended field of view of at least one radar sensor of the device under test.

6. The measurement setup according to claim 1, wherein the reference reflector is positioned by the positioning system such that the scattering members face the imaging system.

7. The measurement setup according to claim 1, wherein the field of view of the imaging system is aligned with a radar field of view provided by at least one radar sensor of the device under test.

8. The measurement setup according to claim 1, wherein the positioning system is at least one of a fixed positioning system and a movable positioning system.

9. The measurement setup according to claim 1, wherein the positioning system comprises a robot.

10. The measurement setup according to claim 1, wherein the positioning system comprises at least one gripper being configured to position at least one of the reference reflector and the device under test.

11. The measurement setup according to claim 10, wherein the at least one gripper has a vacuum sucker.

12. The measurement setup according to claim 1, wherein the positioning system is free of highly reflective components in the area used for measuring the attenuation.

13. The measurement setup according to claim 1, wherein the reference reflector comprises a base to which the several individual scattering members are attached, the several individual scattering members each having a curved tip for reflection, the size of the several individual scattering members being comparable to the wavelength of a signal used for attenuation measurement, the several individual scattering members being arranged with regard to the base such that front and back reflections occur which are separable by the imaging system.

14. The measurement setup according to claim 1, wherein the scattering members are formed by sticks having a diameter corresponding to the wavelength of the signal used for attenuation measurement.

15. A method for measuring attenuation of an irregular surface of a device under test, with the following steps:
   positioning a reference reflector having a collection of diffuse scattering members in front of a three dimensional imaging system that uses electromagnetic signals in the frequency range of a radar system;
   taking a reference image of the reference reflector by using the imaging system;
   positioning the device under test and the reference reflector in front of the imaging system so that the device under test is arranged between the reference reflector and the imaging system;
   taking a measurement image of the reference reflector while the device under test is arranged between the imaging system and the reference reflector by using the imaging system; and
   comparing the images taken to determine the attenuation of the device under test.

16. The method according to claim 15, wherein the image strength at the locations of at least two scattering members of the reference reflector are compared while comparing the images taken.

17. The method according to claim 15, wherein reflection originating from the irregular surface is disregarded.

18. The method according to claim 15, wherein only the scattering members are taken into account that contribute to the intersection between the irregular surface of the device under test and an intended field of view of at least one radar sensor of the device under test.

* * * * *